United States Patent
Zhai

(10) Patent No.: US 12,477,880 B2
(45) Date of Patent: Nov. 18, 2025

(54) DISPLAY MODULE AND DISPLAY DEVICE

(71) Applicant: Hubei Yangtze Industrial Innovation Center Of Advanced Display Co., Ltd., Wuhan (CN)

(72) Inventor: Yingteng Zhai, Wuhan (CN)

(73) Assignee: HUBEI YANGTZE INDUSTRIAL INNOVATION CENTER OF ADVANCED DISPLAY CO., LTD., Wuhan (CN)

( * ) Notice: Subject to any disclaimer, the term of this patent is extended or adjusted under 35 U.S.C. 154(b) by 533 days.

(21) Appl. No.: 17/979,745

(22) Filed: Nov. 2, 2022

(65) Prior Publication Data
US 2024/0079542 A1   Mar. 7, 2024

(30) Foreign Application Priority Data
Sep. 5, 2022   (CN) .......................... 202211077649.4

(51) Int. Cl.
H10H 20/858  (2025.01)
H01L 25/075  (2006.01)
H10H 20/857  (2025.01)

(52) U.S. Cl.
CPC ..... H10H 20/8584 (2025.01); H01L 25/0753 (2013.01); H10H 20/857 (2025.01)

(58) Field of Classification Search
CPC ............ H10H 20/8584; H10H 20/857; H10H 20/858; H01L 25/0753; H01L 25/167; G09G 2300/0426; G09G 2320/041; G09G 3/32; G09F 9/33; G01J 5/0096
See application file for complete search history.

(56) References Cited

U.S. PATENT DOCUMENTS

| 2006/0022214 A1* | 2/2006 | Morgan ................ H05B 45/40 257/E25.032 |
| 2006/0214174 A1* | 9/2006 | Shirakuma .......... G09G 3/3413 257/89 |
| 2024/0185805 A1* | 6/2024 | Hao ..................... G09G 3/3406 |

FOREIGN PATENT DOCUMENTS

| CN | 1837925 A | 9/2006 | |
| CN | 102 88 9689 A | 1/2013 | |
| CN | 103 37 9298 A | 10/2013 | |
| CN | 103730559 A | 4/2014 | |
| CN | 107 384238 A | 11/2017 | |
| CN | 110379842 A * | 10/2019 | ............ H01L 27/32 |
| CN | 111508991 A | 8/2020 | |
| CN | 113449685 A | 9/2021 | |
| JP | 201 31 45786 A | 7/2013 | |
| KR | 200 39 08 56 Y1 | 7/2005 | |

OTHER PUBLICATIONS

The First Office Action for CN Application No. 202211077649.4, dated Jan. 15, 2025, 9 pages.

* cited by examiner

*Primary Examiner* — Jonathan Han
(74) *Attorney, Agent, or Firm* — East IP P.C.

(57) ABSTRACT

The present application discloses a display module and a display device. The display module comprises a substrate, a light emitting device, a radiation component and a detection unit. The light emitting device is on one side of the substrate, and the radiation component is on one side of the light-emitting device close to the substrate. An orthographic projection of the radiation component on the substrate overlapping at least in part with an orthographic projection of the light-emitting device on the substrate.

20 Claims, 15 Drawing Sheets

DISPLAY MODULE AND DISPLAY DEVICE

CROSS-REFERENCE TO RELATED APPLICATION

This application claims priority to Chinese Patent Application No. 202211077649.4, filed on Sep. 5, 2022, which is hereby incorporated by reference in its entirety.

TECHNICAL FIELD

The present application relates to the field of display, in particular to a display module and a display device.

BACKGROUND

With the development of display technology, the performance of display devices is required to be higher and higher. Micro-LED display technology has gradually become the mainstream product of the next generation display due to its low power consumption, long lifetime and high brightness. However, Micro-LED has the problem that its luminous efficiency is greatly affected by temperature, which affects the performance of display devices.

SUMMARY OF THE INVENTION

Embodiments of the present application provide a display module and a display device, by which light-emitting devices in the display module may be detected more precisely in temperature.

An embodiment of a first aspect of the embodiments of the present application provides a display module, comprising: a substrate; a light emitting device on one side of the substrate; a radiation component on one side of the light-emitting device close to the substrate, an orthographic projection of the radiation component on the substrate overlapping at least in part with an orthographic projection of the light-emitting device on the substrate, the radiation component being configured to radiate heat of the light-emitting device in the form of radiation signal; and a detection unit for detecting the radiation signal, the radiation signal being capable of characterizing thermal parameters of the light emitting device.

An embodiment of a second aspect of the present application also provides a display device comprising a display module. The display module comprises: a substrate; a light emitting device on one side of the substrate; a radiation component on one side of the light-emitting device close to the substrate, an orthographic projection of the radiation component on the substrate overlapping at least in part with an orthographic projection of the light-emitting device on the substrate, the radiation component being configured to radiate heat of the light-emitting device in the form of radiation signal; and a detection unit for detecting the radiation signal, the radiation signal being capable of characterizing thermal parameters of the light emitting device.

The display module provided in the present application comprises a substrate, a light emitting device, a radiation component and a detection unit. The radiation component and the detection unit are configured to make temperature detection for the light-emitting device. Specifically, heat of the light-emitting device is radiated by the radiation component in the form of radiation signal, and the radiation signal is detected by the detection unit, for making temperature detection for the light-emitting device.

BRIEF DESCRIPTION OF THE DRAWINGS

In order to more clearly illustrate the technical solution of the embodiments of the present application, the drawings to be used in the embodiments of the present application will be briefly introduce below. Obviously, the drawings described below are only some embodiments of the present application. For ordinary skilled in the art, other drawings may be obtained from these drawings without paying creative work.

In the drawings.

Figure 1:
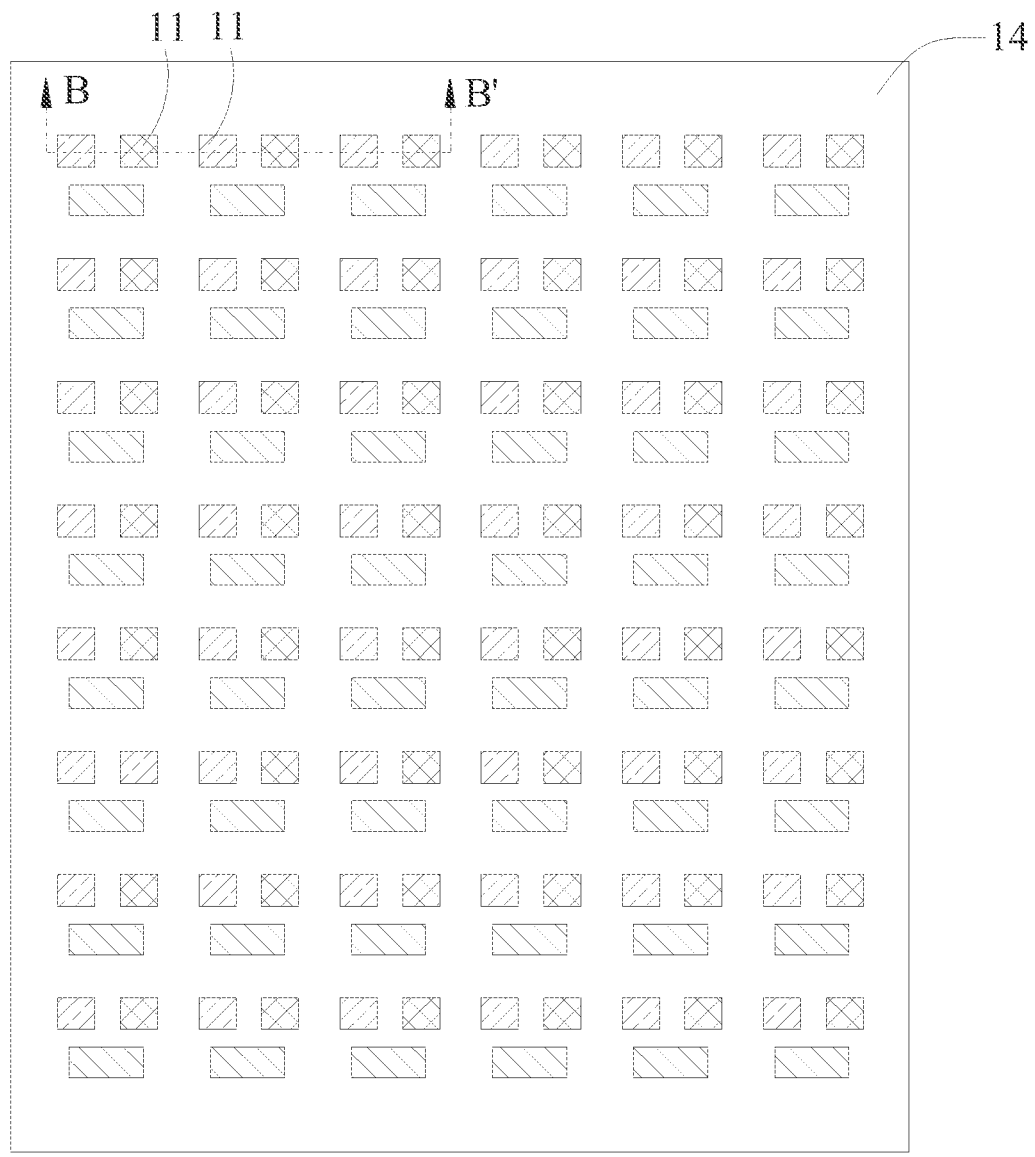
FIG. 1 is a structural diagram of a display module provided in the embodiments of the present application.

1—display module; 10—substrate; 11—light emitting device; 111—first colour light emitting device; 112—second colour light emitting device; 12—radiation component; 121—first radiation component; 122—second radiation component; 123—third radiation component; 124—fourth radiation component; 125—fifth radiation component; 13—detection unit; 131—first detection unit; 132—second detection unit; 133—third detection unit; 14—array layer; 134—infrared detection diode; 135—storage capacitor; 136—switching transistor; 141—transistor; A1—light emitting region; A2 light transmitting region; A3—middle display region; A4—edge display region; A5—transition display region; 15—driving chip; 16—temperature detection driving device; S1—scanning signal line; D1—data outgoing signal line; Vss—first fixed voltage; X—first direction; Y—second direction; 17—connecting component; 171—first flexible circuit board; 172—second flexible circuit board; 173—connector; 174—flexible circuit board; 18—bearing base; 19—grounding metal film; 2—display device.

DETAILED DESCRIPTION

Features and exemplary embodiments of various aspects of the present application will be described in detail below. In the following detailed description, many specific details are provided in order to provide a comprehensive understanding of the present application. However, it is obvious to those skilled in the art that the present application may be implemented without some of these specific details. The following description of embodiments is only intended to provide a better understanding of the present application by showing examples of the present application.

It should be noted that, relational terms herein such as first and second are only used to distinguish one entity or operation from another entity or operation, and do not necessarily require or imply that there is any such actual relationship or order between these entities or operations. Moreover, the terms "include", "comprise" or any other variant thereof are intended to cover non-exclusive inclusion, so that a process, method, article or device including a series of elements not only includes those elements, but also includes other elements not explicitly listed, or also includes elements inherent to such process, method, article or device. Without more restrictions, the elements defined by the statement "comprising . . . " do not exclude that there are other identical elements in the process, method, article or device including the elements.

It is found by the inventor through research that, in view of the problem that luminous efficiency of Micro-LED display device is greatly affected by temperature, which affects the performance of the display device. In the conventional technology, a temperature sensor is set in the Micro-LED display module to obtain real-time temperature, and the luminous efficiency of the Micro-LED is compensated according to the real-time temperature. But the temperature sensor is set inside the Micro-LED display panel, and temperature signal obtained by the temperature sensor is transmitted to a driving chip of the display panel through a wire. Because the wire is greatly interfered by the temperature and the circuits in the display panel, it is easy to cause the distortion of the temperature signal, resulting inaccurate compensation. Based on the research on the above problems, a display module and a display device are provided to achieve more accurate compensation and improve display quality.

In order to better understand the present application, the display module and the display device according to the embodiments of the present application will be described in detail below in combination with FIG. 1 to FIG. 22.

Figure 2:
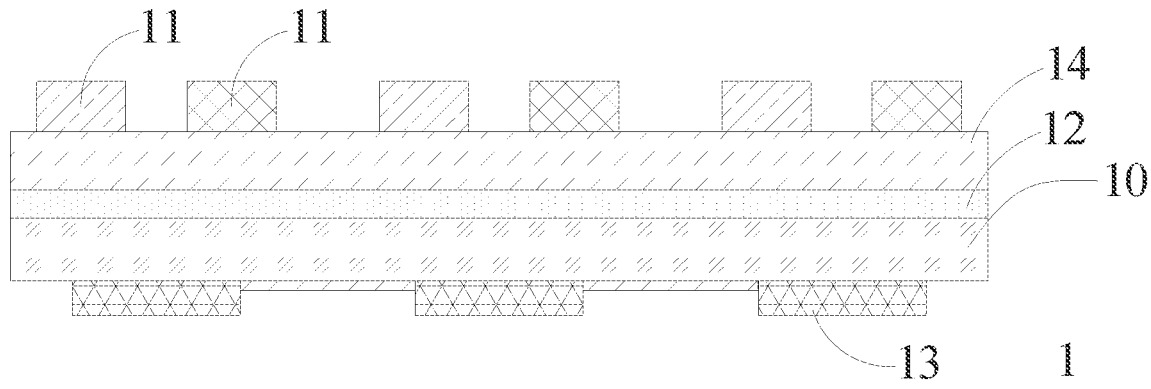
FIG. 2 is a sectional view along B-B' in FIG. 1.

Referring to FIG. 1 and FIG. 2, an embodiment of the present application provides a display module 1, including a substrate 10, a light emitting device 11, a radiation component 12, and a detection unit 13. The light emitting device 11 is located on one side of the substrate 10. The radiation component 12 is located on one side of the light emitting device 11 close to the substrate 10. An orthographic projection of the radiation component 12 on the substrate 10 overlaps at least in part with an orthographic projection of the light emitting device 11 on the substrate 10. The radiation component 12 is configured to radiate heat of the light emitting device 11 in the form of radiation signal. The detection unit 13 is configured to detect the radiation signal, which can be used to characterize thermal parameters of the light emitting device 11.

In the display module 1 provided in the present application, the substrate 10 is made of transparent materials. The substrate 10 may be a flexible substrate 10, which is formed from thin polymers, such as polyimide. Alternatively, the substrate 10 may be a rigid substrate, which is made of glass. The materials of the substrate 10 are not specifically defined in the present application.

The light-emitting device 11 may be Micro-LED, which has luminous efficiency greatly affected by temperature. It can be understood that the light-emitting device 11 may also be OLED, Mini-LED, or the like. As long as the luminous efficiency is affected by temperature, the light-emitting device 11 may be applied to the present application, which is not specifically defined. The Micro-LED is only described in detail by taking as an example in the present application.

The display module 1 provided in the present application includes a substrate 10, a light emitting device 11, a radiation component 12 and a detection unit 13. The radiation component 12 and the detection unit 13 are configured to make temperature detection for the light-emitting device 11. Specifically, heat of the light-emitting device 11 is radiated by the radiation component 12 in the form of radiation signal, and the radiation signal is detected by the detection unit 13, for making temperature detection for the light-emitting device 11. In the display module 1, signal transmission between the radiation component 12 and the detection unit 13 is by wireless transmission, which may improve signal distortion caused by the transmission through wiring. For example, signal in the wiring is vulnerable to the interference of electrical signal in the display module 1 and the influence of temperature on resistance of the wiring itself, so that the signal in the wiring is prone to distortion. In the display module 1 provided in the present application, the signal transmission between the radiation component 12 and the detection unit 13 is by wireless transmission, which may effectively improve the signal distortion in the temperature detection process. The signal transmission is more accurate, so that the temperature detection for the light-emitting device 11 is more accurate, so as to improve compensation accuracy when the light-emitting device 11 is compensated according to the temperature of the light-emitting device 11, to further improve display quality of the display module 1.

Figure 3:
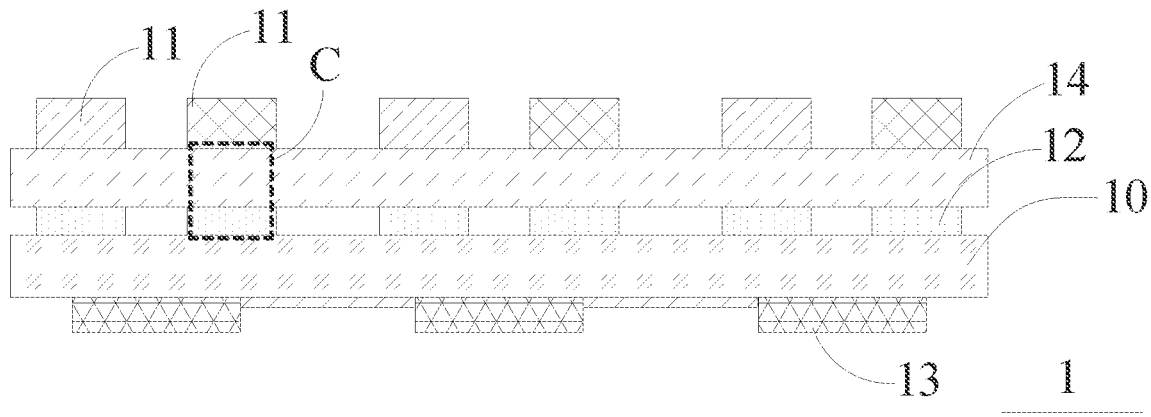
FIG. 3 is another sectional view along B-B' in FIG. 1.

In the display module 1 provided in the present application, an orthographic projection of the radiation component 12 on the substrate 10 overlaps at least in part with an orthographic projection of the light-emitting device 11 on the substrate 10, including the case where the orthographic projections of the radiation component 12 and the light-emitting device 11 on the substrate 10 overlap, as shown in FIG. 2. The orthographic projections of the radiation component 12 and the light emitting device 11 on the substrate 10 are completely overlapped, as shown in FIG. 3. As shown in FIG. 2, as overlapping in part, the orthographic projection of the radiation component 12 on the substrate 10 may be larger than the orthographic projection of the light-emitting device 11 on the substrate 10, and the orthographic projection of the radiation component 12 on the substrate covers the orthographic projection of the light-emitting device 11 on the substrate 10, so that the radiation component 12 may absorb the heat of the light-emitting device 11 to a greater extent to improve the accuracy of temperature detection.

In a possible embodiment, the radiation component 12 is a light absorbing film, and the radiation signal is infrared.

Herein, infrared, also known as infrared radiation, is referred to an electromagnetic wave having a wavelength of 0.78-1000 μm. Wherein the wavelength of 0.78-1.5 μm is referred to near infrared, the wavelength of 0.78-1.5 μm is referred to mid infrared, and the wavelength of 0.78-1.5 μm is referred to far infrared. The wavelength of 2.0-1000 μm is also known as thermal infrared. Infrared radiation is based on irregular movement of molecules and atoms of any object in the conventional environment, and constantly radiates thermal infrared energy.

The radiation component 12 is a light absorbing film with the function of absorbing infrared. The light absorbing film may absorb infrared rays emitted by the external environment, the circuit devices in the display module 1 and the light-emitting device 11, and emit directly related blackbody radiation only due to its own temperature. The blackbody radiation is a radiation signal which is infrared rays. That is, in the process of temperature detection, the light absorbing film is configured to acquire the heat of the light-emitting device 11 (by means of heat transfer) and radiate the heat in the form of the radiation signal, so that the detection unit 13 may receive and detect the radiation signal. The radiation signal is an infrared line. At the same time, the light absorbing film absorbs the infrared ray with interference properties, including the external environment, circuit devices in the display module 1 and infrared ray emitted by the light-emitting device 11, to prevent the infrared ray with interference property from being detected by the detection unit 13, so that the detection unit 13 may only detect the radiation signal related to the heat of the light-emitting device 11, and prevent the detection unit 13 from detecting the infrared ray with interference property, thus improving the accuracy of temperature detection.

In one possible embodiment, the material of the light absorbing film includes at least one of molybdenum sulfide and ink. It may also include coal, black paint or carbon nanotubes, etc.

In the above embodiments, the light absorbing film is made of dark materials, specifically black materials, to facilitate the absorption of infrared rays with interference properties, and to obtain the heat of the light-emitting device 11 by means of heat transfer, emitting infrared radiation signals only according to its own heat thus ensuring the accuracy of temperature detection.

Figure 4:
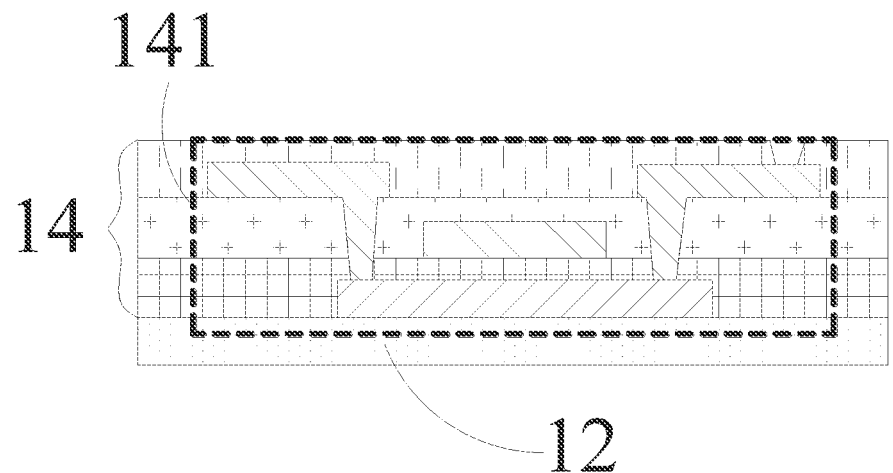
FIG. 4 is an enlarged view of area C in FIG. 3.

In a possible embodiment, as shown in FIG. 2, FIG. 3 and FIG. 4, the display module 1 provided in the present application also includes an array layer 14, which is located on one side of the light-emitting device 11 close to the substrate 10. The radiation component 12 is located on one side of the array layer 14 close to the substrate 10.

In the above embodiment, the array layer 14 includes a transistor 141, and the radiation component 12 is arranged on one side of the array layer 14 close to the substrate 10 to shield the infrared ray generated in channel region of the transistor 141, so that the infrared ray generated in the channel region of the transistor 141 is absorbed by the radiation component 12 when it is irradiated on the radiation component 12, preventing the infrared ray generated in the channel region from being detected by the detection unit 13 and affecting the accuracy of temperature detection.

In one possible embodiment, the radiation component 12 is corresponding to at least one light emitting device 11.

In the above embodiment, as shown in FIG. 2 and FIG. 3, the radiation component 12 can be arranged in a whole layer, that is, the orthographic projection of the radiation component 12 on the substrate 10 covers the substrate 10. Alternatively, the radiation component 12 has a patterned structure, that is, the radiation component 12 is divided into multiple regions, and different regions are set discontinuously, so that different regions can be independent of each other, reducing the heat conduction between different regions, and thus improving the accuracy of the radiation signal in each region.

In the above embodiment, the radiation component 12 is configured to radiate the heat of the light emitting device 11 in the form of a radiation signal, so that the detection unit 13 may receive and detect the radiation signal, thereby making temperature detection for the light emitting device 11. On one hand, it is necessary to obtain the heat of the light-emitting device 11 by means of heat transfer through the radiation component 12 and radiate it by means of the radiation signal; on the other hand, it is necessary to isolate other infrared rays with interference properties through the radiation component 12 to prevent the infrared lines with interference properties from affecting the detection results of the detection unit 13, thereby improving the accuracy of temperature detection. Therefore, the radiation component 12 needs to be set corresponding to the light-emitting device 11, so as to accurately obtain the heat of the light-emitting device 11 and isolate the interference of infrared rays with interference properties. Wherein, the radiation component 12 corresponding to the light emitting device 11 means that the orthographic projection of the radiation component 12 on the substrate 10 overlaps at least in part with the orthographic projection of the light emitting device 11 on the substrate 10. Specifically, the orthographic projection of the light emitting device 11 on the substrate 10 is located in the orthographic projection of the radiation component 12 on the substrate 10, so that the radiation component 12 can better isolate infrared rays with interference properties.

Figure 5:
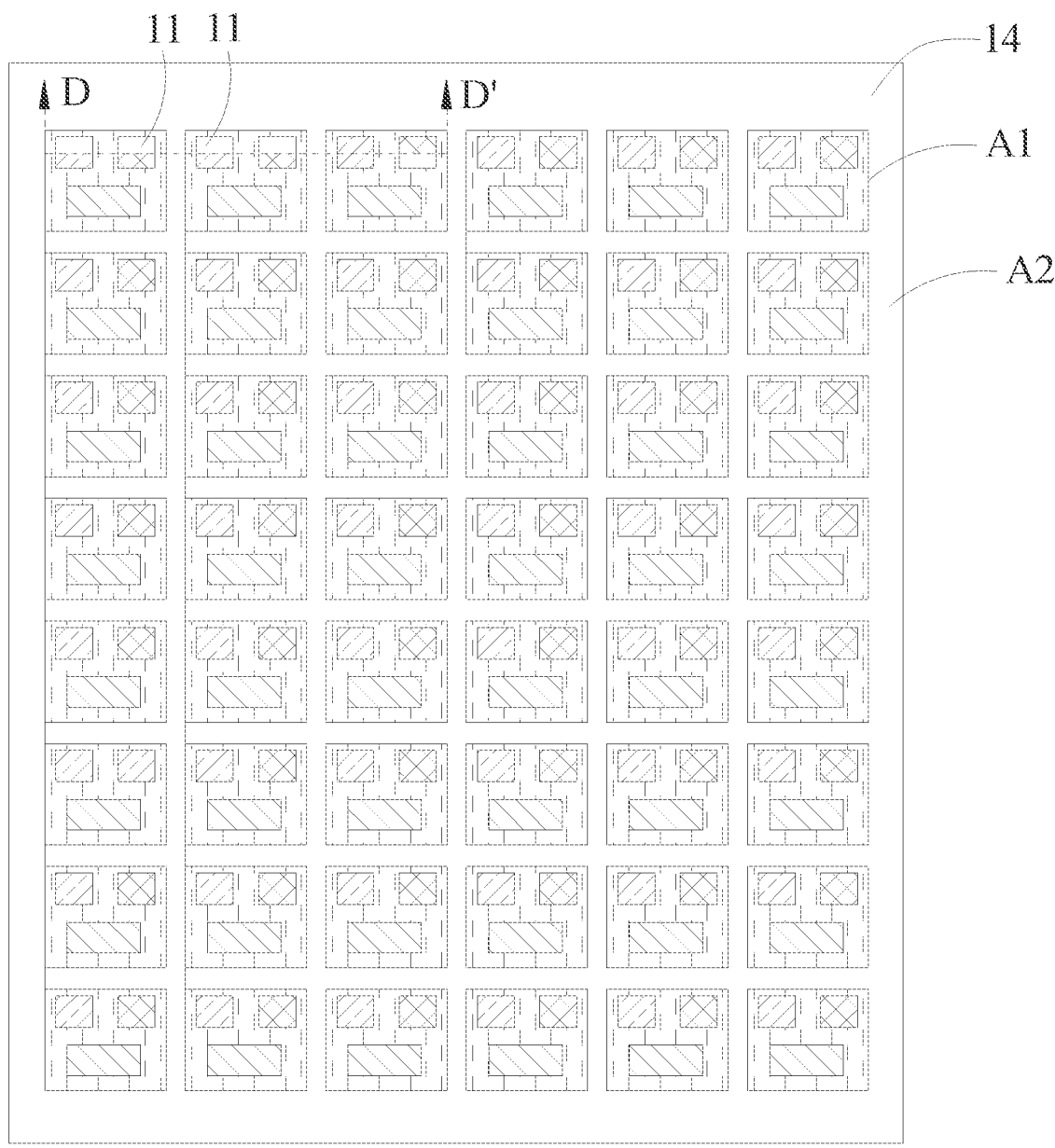
FIG. 5 is a structural diagram of another display module provided in the embodiments of the present application.
Figure 6:
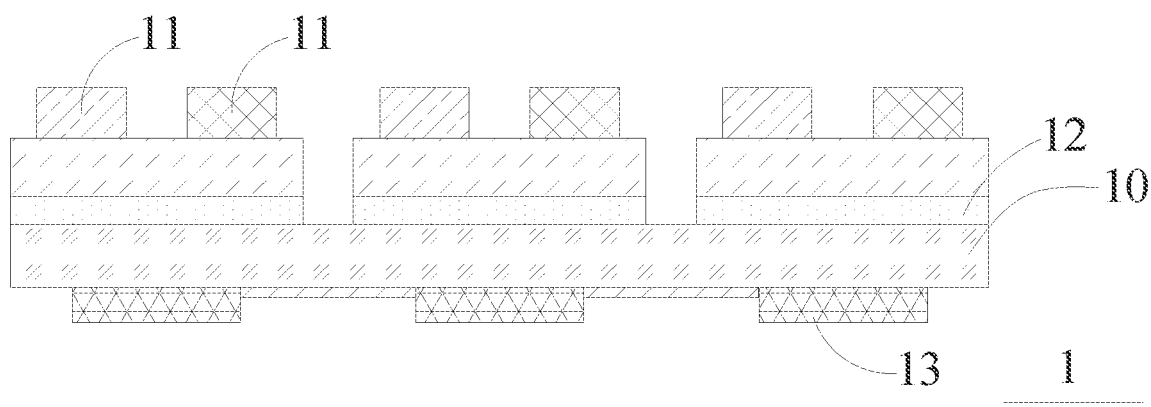
FIG. 6 is a sectional view along D-D' in FIG. 5.

In a possible embodiment, as shown in FIG. 5 and FIG. 6, the display module 1 includes a plurality of light emitting regions A1 and a light transmitting region A2 located around the light emitting regions A1, the light emitting regions A1 include at least one light emitting device 11, and the radiation component 12 is located in the light emitting region A1.

In the above embodiment, the display module 1 may be a transparent display module 1, including a light emitting region A1 and a light transmitting region A2, the light emitting region A1 includes a light emitting device 11 for display, and the light transmitting region A2 does not include any light emitting device 11, but only for light transmission. The radiation component 12 adopts a patterned design and is only disposed in the light emitting region A1 to obtain the heat of the light emitting device 11. The radiation component 12 is not disposed in the light transmitting region A2, so as to avoid affecting the light transmittance of the light transmitting region A2 and ensure the performance of the transparent display module 1.

Figure 7:
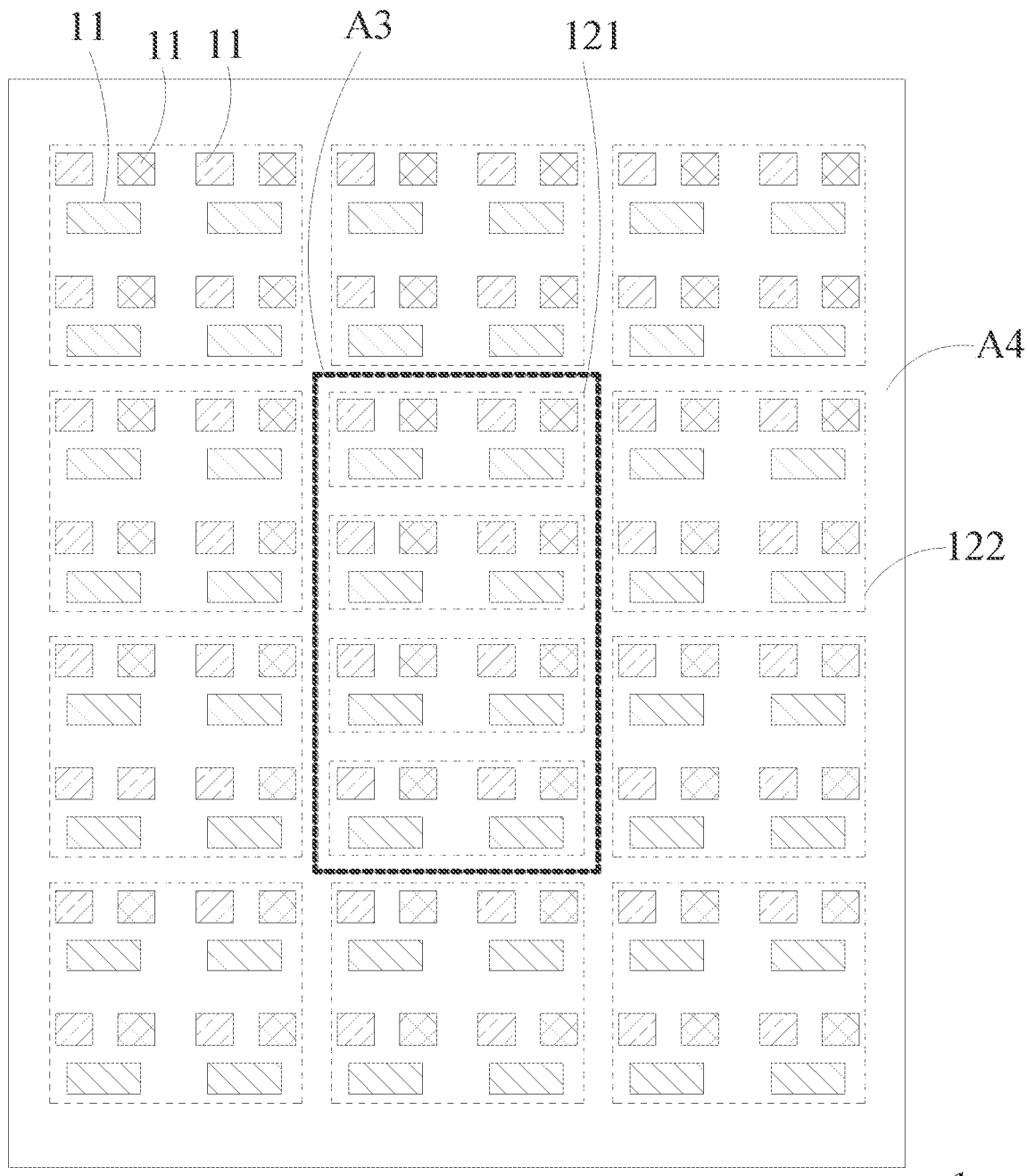
FIG. 7 is a structural diagram of another display module provided in the embodiments of the present application.

In a possible embodiment, as shown in FIG. 7, the radiation component 12 is patterned. Specifically, the radiation component 12 includes a first radiation component 121 and a second radiation component 122. The number of light emitting devices 11 corresponding to the first radiation component 121 is M, and the number of light emitting devices 11 corresponding to the second radiation component 122 is N, and one of M and N is greater than the other.

In the above embodiment, the radiation component 12 includes a first radiation component 121 and a second radiation component 122. The number of light emitting devices 11 corresponding to the first radiation component 121 is M, that is, the number of the orthographic projection of the light emitting device 11 on the substrate 10 located in the orthographic projection of the first radiation component 121 on the substrate 10 is M. The number of light emitting devices 11 corresponding to the second radiation component 122 is N, that is, the number of the orthographic projection of the light emitting device 11 on the substrate 10 located in the orthographic projection of the second radiation component 122 on the substrate 10 is N.

In the above embodiment, one of M and N is greater than the other, that is, the areas of the first radiation component 121 and the second radiation component 122 are different. It can be understood that the smaller the area of the radiation component 12 is, the smaller the number of corresponding light emitting devices 11 is, the less the interference of each radiation component 12 from other light emitting devices 11 is, and the higher the accuracy of temperature detection is. Therefore, the radiation components 12 at each position can be designed differently according to the accuracy requirements of temperature detection at each position in the display module 1. Differential design according to different attention levels of human eyes in different areas of display module 1 may be involved. The details are as follows:

In a specific embodiment, the display module 1 includes an middle display region A3 around the center of the display module 1 and an edge display region A4 around the middle display region A3. The first radiation component 121 is located in the middle display region A3, and the second radiation component 122 is located in the edge display region A4; wherein, M<N.

In the above embodiment, the middle display region A3 is more easily noticed by the human eye than the edge display region A4, so that the display quality of the middle display region A3 is more likely to affect the overall use feeling of the display module 1. The first radiation component 121 is located in the middle display region A3, and the second radiation component 122 is located in the edge display region A4; and the number of light emitting devices 11 corresponding to the first radiation component 121 is less than the number of light emitting devices 11 corresponding to the second radiation component 122, that is, M<N. The number of light emitting devices 11 corresponding to the first radiation component 121 is less than that of the second radiation component 122, which makes the heat influence between the light emitting devices 11 corresponding to the first radiation component 121 smaller, and the heat of the light emitting device 11 obtained through the first radiation component 121 is more accurate, thus making the temperature detection accuracy for the middle display region A3 higher. When the light emitting device 11 is adjusted by the obtained temperature, the luminous efficiency adjustment for the light-emitting device 11 in the middle display region A3 is more effective, thereby effectively improving the display quality of the middle display region A3 and improving the user experience. At the same time, the number of light emitting devices 11 corresponding to the second radiation component 122 in the edge display region A4 is greater, so that the number of radiation components 12 in the display module 1 may be reduced when the light emitting device 11 is certain, that is, the patterning process and the preparation process of the radiation component 12 can be simplified.

Figure 8:
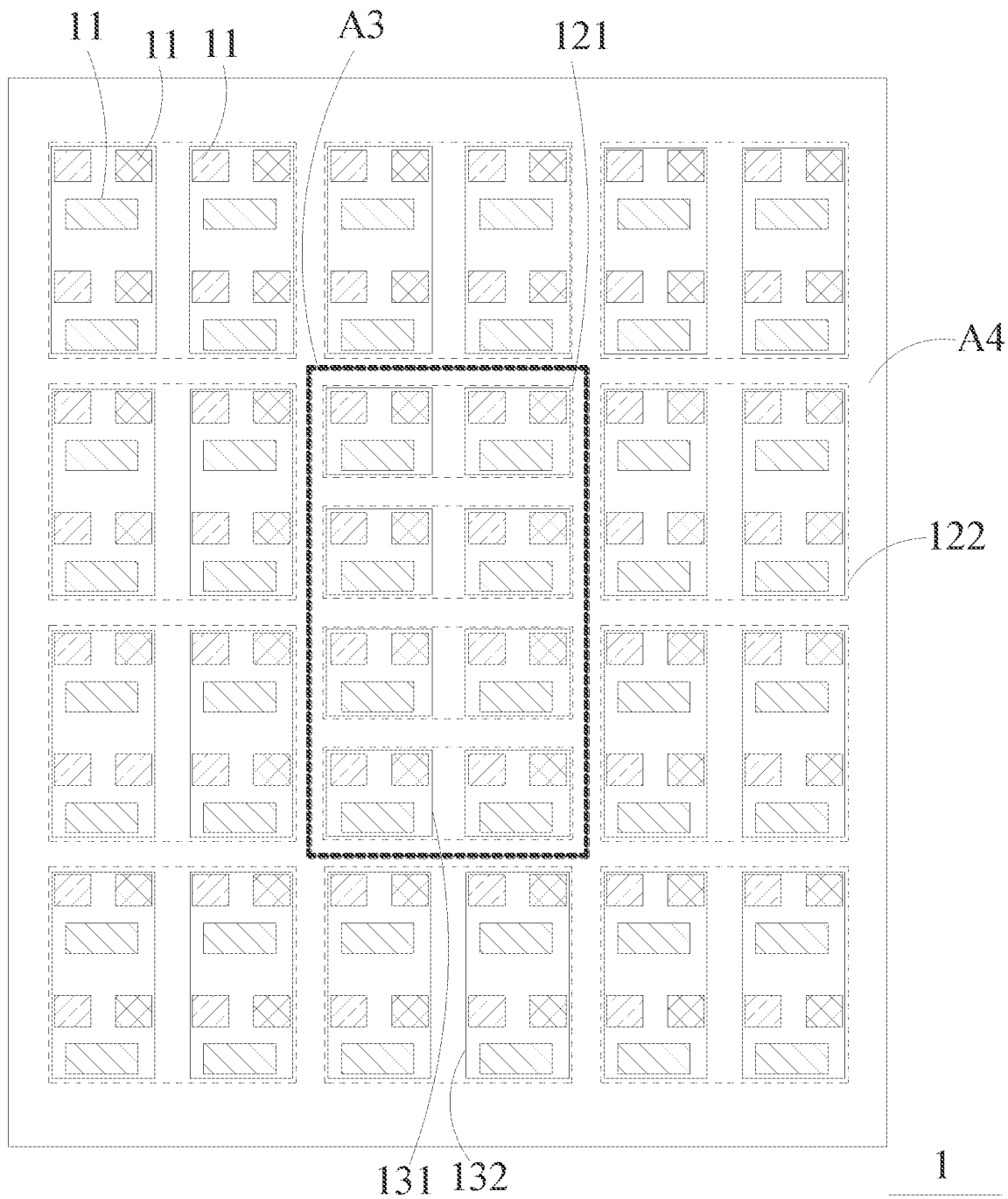
FIG. 8 is a structural diagram of another display module provided in the embodiments of the present application.

In a specific embodiment, as shown in FIG. 8, the detection unit 13 includes a first detection unit 131 and a second detection unit 132. The first radiation component 121 is corresponding to at least one first detection unit 131, the second radiation component 122 is corresponding to at least one second detection unit 132, the number of light-emitting devices 11 corresponding to the first detection unit 131 is P, and the number of light-emitting devices 11 corresponding to the second detection unit 132 is Q, wherein, P≤Q.

In the above embodiment, the middle display region A3 is more easily noticed by the human eye than the edge display region A4, so that the display quality of the middle display region A3 is more likely to affect the overall use feeling of the display module 1. The first radiation component 121 is located in the middle display region A3, and the second radiation component 122 is located in the edge display region A4, and M<N. At the same time, the first radiation component 121 is corresponding to at least one first detection unit 131, the second radiation component 122 is corresponding to at least one second detection unit 132, the number of light emitting devices 11 corresponding to the first detection unit 131 is P, and the number of light emitting devices 11 corresponding to the second detection unit 132 is Q, wherein, P≤Q. That is, the number of light emitting devices 11 corresponding to the first detection unit 131 in the middle display region A3 is less than or equal to the number of light emitting devices 11 corresponding to the second detection unit 132 in the edge display region A4. Wherein:

When the number of light emitting devices 11 corresponding to the first detection unit 131 in the middle display region A3 is equal to the number of light emitting devices 11 corresponding to the second detection unit 132 in the edge display region A4, the difference in temperature detection accuracy between the middle display region A3 and the edge display region A4 is only affected by the difference between the first radiation component 121 and the second radiation component 122.

When the number of light emitting devices 11 corresponding to the first detection unit 131 in the middle display region A3 is less than the number of light emitting devices 11 corresponding to the second detection unit 132 in the edge display region A4, the difference in temperature detection accuracy between the middle display region A3 and the edge display region A4 is affected not only by the difference between the first radiation component 121 and the second radiation component 122, but also by the difference between the first detection unit 131 and the second detection unit 132. At this time, the first radiation component 121 is more accurate in acquiring heat than the second radiation component 122, and the first detection unit 131 has fewer light-emitting devices 11 corresponding to the second detection unit 132, so the first detection unit 131 is more accurate in acquiring radiation signals than the second detection unit 132, thus further improving the temperature detection accuracy of the middle display region A3.

Specifically, the number of the first detection units 131 corresponding to the first radiation component 121 is T1, the number of the second detection units 132 corresponding to the second radiation component 122 is T2, and the size of T1 and T2 are not specifically defined in this application. For example, the first radiation component 121 is corresponding to 3 light emitting devices 11, the second radiation component 122 is corresponding to 12 light emitting devices 11, and the number of the first detection units 131 corresponding to the first radiation component 121 may be 3, and the number of the second detection units 132 corresponding to the second radiation component 122 may be 3 or 4, which can make the number of light emitting devices 11 corresponding to the first detection unit 131 less than the number of light emitting devices 11 corresponding to the second detection unit 132, which is not specifically defined in the present application.

Figure 9:
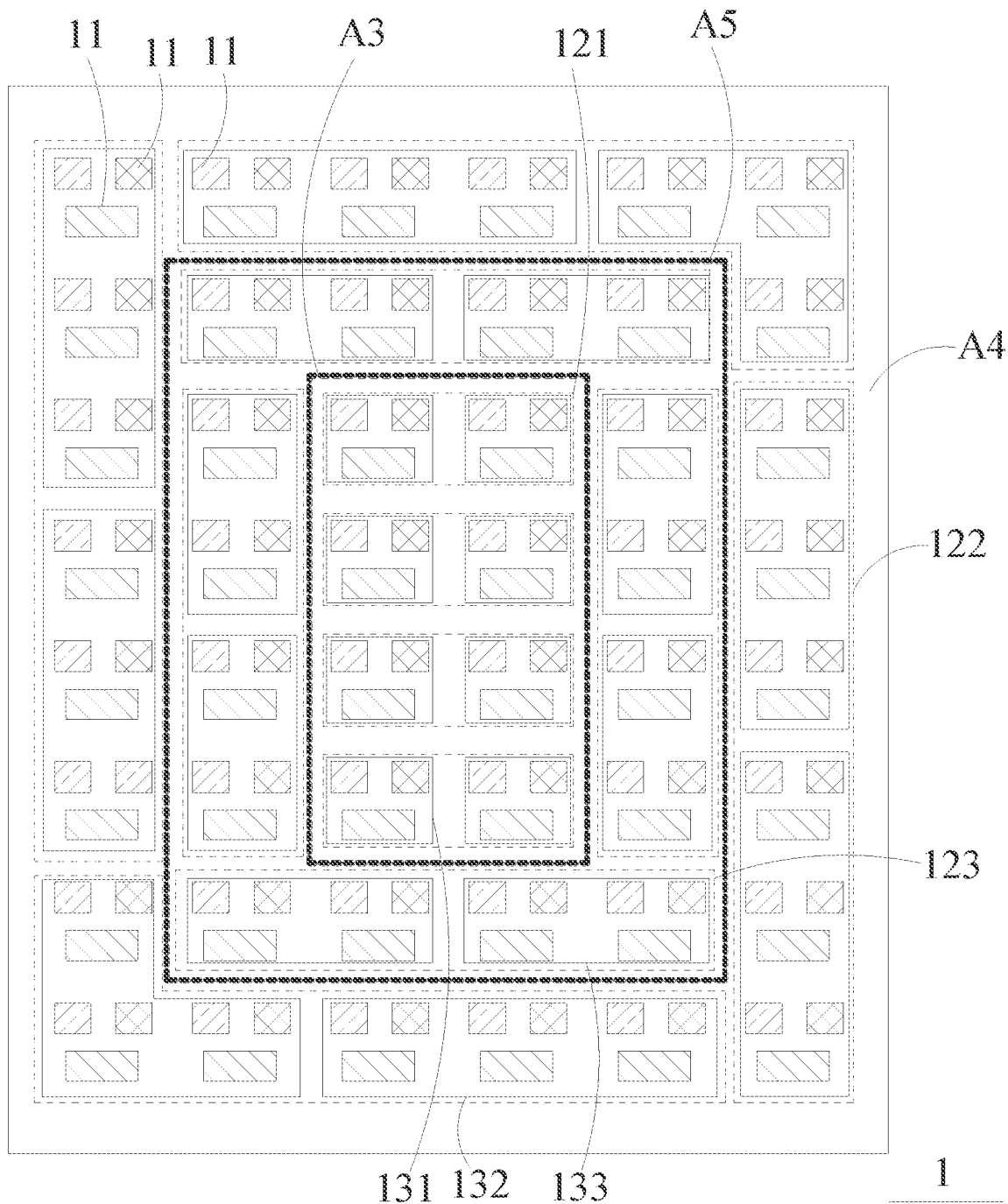
FIG. 9 is a structural diagram of another display module provided in the embodiments of the present application.

In a possible embodiment, as shown in FIG. 9, the display module 1 also includes a transition display region A5 located between the middle display region A3 and the edge display region A4. The radiation component 12 also includes a third radiation component 123, which is located in the transition display region A5, and the number of light emitting devices 11 corresponding to the third radiation component 123 is S; wherein, M<S<N.

In the above embodiment, a transition display region A5 is disposed between the middle display region A3 and the edge display region A4. By setting the number of light emitting devices 11 corresponding to the third radiation component 123 located in the transition display region A5 to be greater than the number of light emitting devices 11 corresponding to the first radiation component 121 and less than the number of light emitting devices 11 corresponding to the second radiation component 122, the temperature acquisition accuracy of the middle display region A3, the transition display region A5 and the edge display region A4 decreases gradually.

Specifically, M, S, N may be increased in accordance with the law of equal difference or the law of equal proportion, which is not specifically defined in the present application.

Specifically, the number of transition display regions A5 may be one, or more than one around the middle display regions A3 nesting layer by layer, which is not specifically defined in the present application. When a plurality of transition display regions A5 are included, it is necessary to follow the rule that the number of light-emitting devices 11 corresponding to the radiation components 12 in each transition display region A5 decreases gradually from the middle display region A3 to the edge display region A4, so that the acquisition accuracy decreases gradually. When the light-emitting efficiency of the light-emitting device 11 is adjusted by the obtained temperature, the luminous efficiency adjustment for the light-emitting device 11 are less effective gradually from the middle to the edge, reducing contrast difference between adjacent display regions and improving user experience while the display quality of the middle display region A3 is improved.

In a possible embodiment, as shown in FIG. 9, the detection unit 13 includes a first detection unit 131, a second detection unit 132, and a third detection unit 133. The first radiation component 121 is corresponding to at least one first detection unit 131, the second radiation component 122 is corresponding to at least one second detection unit 132, the third radiation component 123 is corresponding to at least one third detection unit 133, and the number of light-emitting devices 11 corresponding to the first detection unit 131 is P, the number of light-emitting devices 11 corresponding to the second detection unit 132 is Q, and the number of light-emitting devices 11 corresponding to the third detection unit 133 is T, wherein P≤T≤Q.

That is, the number P of light emitting devices 11 corresponding to the first detection unit 131 in the middle display region A3 is less than or equal to the number T of light emitting devices 11 corresponding to the third detection unit 133 in the transition display region A5, and the number T of light emitting devices 11 corresponding to the third detection unit 133 in the transition display region A5 is less than or equal to the number Q of light emitting devices 11 corresponding to the second measurement unit in the edge display region A4, wherein:

When P=T=Q, the difference in temperature detection accuracy between the middle display region A3 and the edge display region A4 is only affected by the difference between the first radiation component 121, the second radiation component 122 and the third radiation component 123.

When P<T<Q, the difference in temperature detection accuracy between the middle display region A3 and the edge display region A4 is affected not only by the difference between the first radiation component 121, the second radiation component 122 and the third radiation component 123, but also by the difference between the first detection unit 131, the second detection unit 132 and the third detection unit 133. At this time, the first radiation component 121 is more accurate in acquiring heat than the third radiation component 123, the third radiation component 123 is more accurate in acquiring heat than the second radiation component 122, the number of light-emitting devices 11 corresponding to the first detection unit 131 is less than the number of light-emitting devices 11 corresponding to the third detection unit 133, and the number of light-emitting devices 11 corresponding to the third detection unit 133 is less than the number of light-emitting devices 11 corresponding to the second detection unit 132. Thus, the first detection unit 131 is more accurate in acquiring the radiation signal than the third detection unit 133, and the third detection unit 133 is more accurate in acquiring the radiation signal than the second detection unit 132, so that the temperature detection accuracy gradually decreases from the middle display region A3 to the edge display region A4.

Specifically, the number of the first detection units 131 corresponding to the first radiation component 121 is T1, the number of the second detection units 132 corresponding to the second radiation component 122 is T2, the number of the third detection units 133 corresponding to the third radiation component 123 is T3, and the size of T1, T2, T3 are not specifically defined in the present application.

Figure 10:
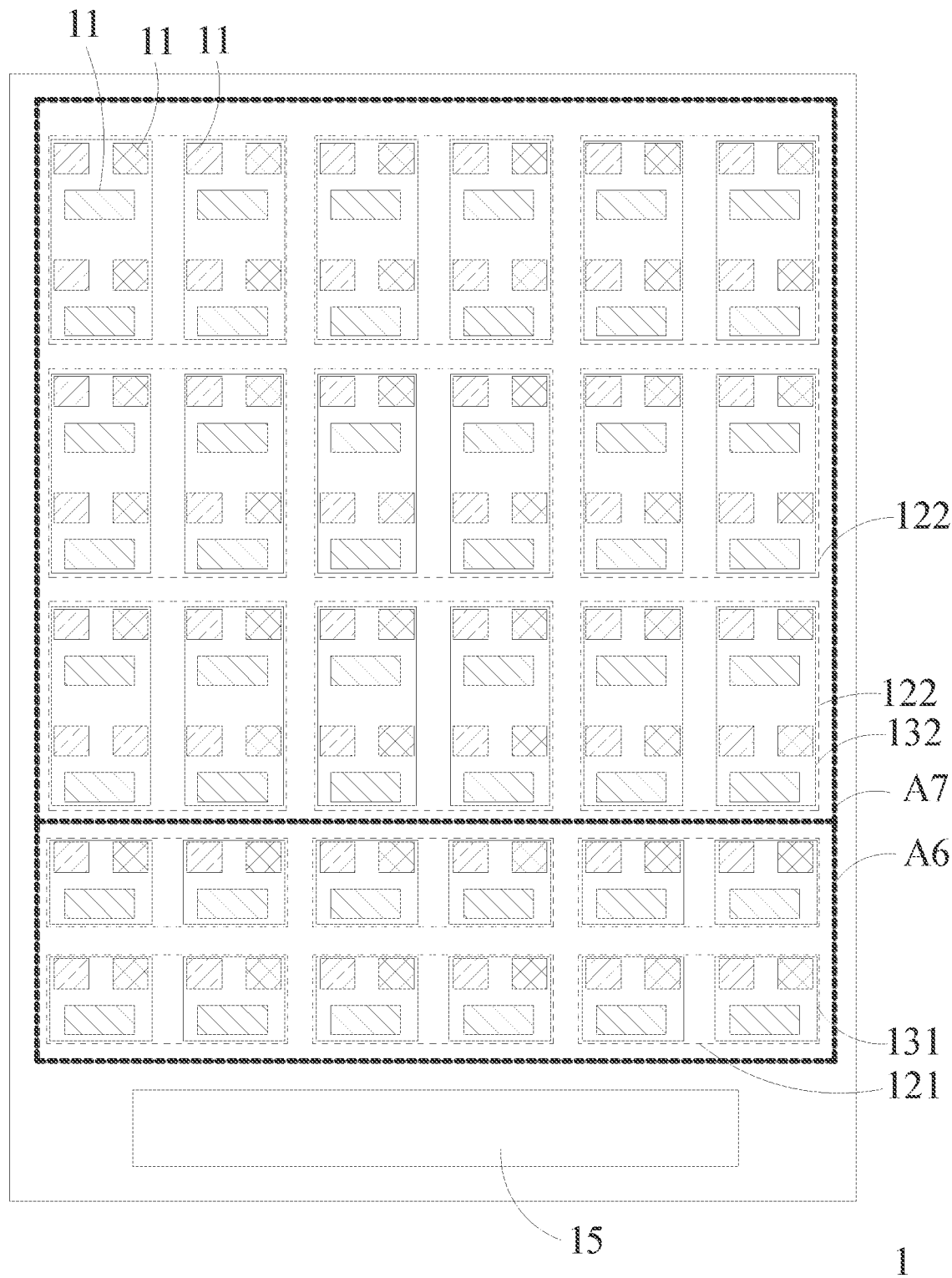
FIG. 10 is a structural diagram of another display module provided in the embodiments of the present application.

In another specific embodiment, according to the accuracy requirements of temperature detection at each position of the display module 1, the differential design of the radiation components 12 at each position may also include: differential design according to different heating conditions in different areas of the display module 1, as follows:

As shown in FIG. 10, in the display module 1, the position near the lower frame is often provided with a driving chip 15, which makes the heat in a region A6 near the lower frame larger. Therefore, the light emitting device 11 in the region A6 is greatly affected by the heat, and the difference between the light emitting efficiency of the light emitting devices 11 in another region A7 is more obvious. The temperature detection accuracy in the region A6 may be improved through differential design, and the luminous efficiency of the light-emitting device 11 in the region A6 may be adjusted according to the temperature, so as to reduce the difference of luminous effect of the light-emitting device 11 in each area of the display module 1 and improve the display uniformity. Specifically, the first radiation component 121 may be disposed in the region A6 near the lower frame, and the second radiation component 122 may be disposed in another region A7; the number of light emitting devices 11 corresponding to the first radiation component 121 is M, and the number of light emitting devices 11 corresponding to the second radiation component 122 is N, where M<N. And/or, the first detection unit 131 is disposed in the region A6 near the lower frame, and the second detection unit 132 is disposed in another region A7. The number of light emitting devices 11 corresponding to the first detection unit 131 is P, and the number of light emitting devices 11 corresponding to the second detection unit 132 is Q, where P<Q. The specific principles may be referred to the specific contents of the above embodiments, and will not be repeated in the present application.

Figure 11:
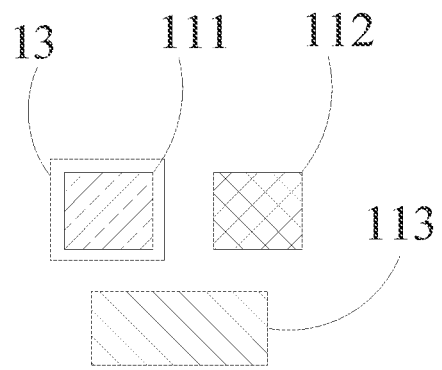
FIG. 11 is a local structure diagram of another display module provided in the embodiments of the present application.

In a possible embodiment, as shown in FIG. 11, the light emitting device 11 includes a first color light emitting device 111 and a second color light emitting device 112. The detection unit 13 is corresponding to the first color light emitting device 111, and a wavelength of light emitted by the first color light emitting device 111 is greater than a wavelength of light emitted by the second color light emitting device 112.

In the above embodiment, the light emitting effects of different color light emitting devices 11 are affected by temperature differently. Wherein the light emitting effect of the first color light emitting device 111 is more seriously affected by temperature. Only the detection unit 13 corresponding to the first color light emitting device 111 can be disposed in the display module 1 to detect the temperature of the first color light emitting device 111, and adjust the light emitting efficiency of the first color light emitting device 111 according to temperature. Thus, in the case of reducing the preparation process of the display module 1, the light-emitting device 11 that is most affected by temperature is compensated to improve the cost performance.

In the above embodiment, the first color light emitting device 111 can be a red light emitting device 11, and the second color light emitting device 112 can be a green light emitting device 11.

Figure 12:
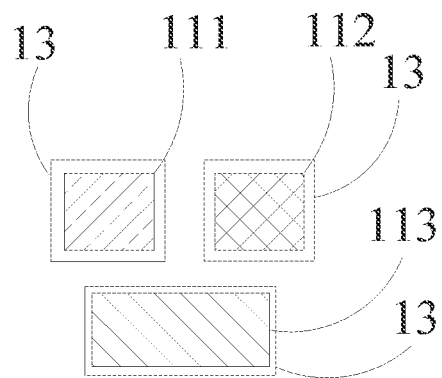
FIG. 12 is a local structure diagram of another display module provided in the embodiments of the present application.

As shown in FIG. 12, the light emitting device 11 may also include a third color light emitting device 113, which may be a blue light emitting device 11. The light emitting effects of the second color light emitting device 112 and the third color light emitting device 11 are less affected by temperature. The display module 1 may be provided with detection units 13 corresponding to the second color light emitting device 112 and the third color light emitting device 113, respectively, to adjust the light emitting efficiency of the second color light emitting device 112 and the third color light emitting device 113 according to temperature, so as to further improve the display quality of the display module 1.

Figure 13:
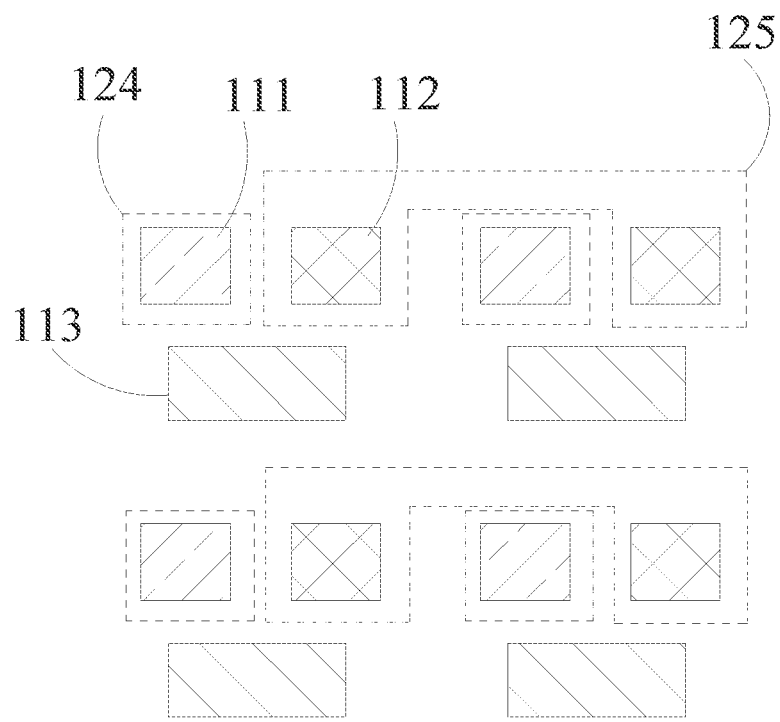
FIG. 13 is a local structure diagram of another display module provided in the embodiments of the present application.

In a possible embodiment, as shown in FIG. 13, the radiation component 12 includes a fourth radiation component 124 and a fifth radiation component 125, the fourth radiation component 124 is corresponding to the first color light emitting device 111, and each fourth radiation component 124 has the same area, the fifth radiation component 125 is corresponding to the second color light emitting device 112, and each fifth radiation component 125 has the same area.

In the above embodiment, the fourth radiation component 124 is corresponding to the first color light emitting device 111. Specifically, the number of the fourth radiation component 124 may be multiple. Each fourth radiation component 124 may correspond to a preset number of first color light emitting devices 111. In each fourth radiation component 124 and its corresponding first color light emitting device 111, an orthographic projection of the first color light emitting device 111 on the substrate is located in an orthographic projection of the fourth radiation component 124 on the substrate. The fifth radiation component 125 is corresponding to the second color light emitting device 112. Specifically, the number of the fifth radiation component 125 may be multiple. Each fifth radiation component 125 may correspond to a preset number of second color light emitting devices 112. In each fifth radiation component 125 and its corresponding second color light emitting device 112, an orthographic projection of the second color light emitting device 112 on the substrate is located in an orthographic projection of the fifth radiation component 125 on the substrate.

In the above embodiment, each color light emitting device 11 is opposite to a radiation component 12 to avoid errors caused by different heat of different color light emitting devices 11. At the same time, the area of each fourth radiation component 124 is set to be the same, and the area of each fifth radiation component 125 is set to be the same, which may reduce the error caused by different heat acquisition areas and heat conduction of different radiation components 12.

In a possible embodiment, the radiation signal is infrared, and infrared sensing devices are correspondingly selected by the detection unit 13 to facilitate infrared sensing.

Figure 14:
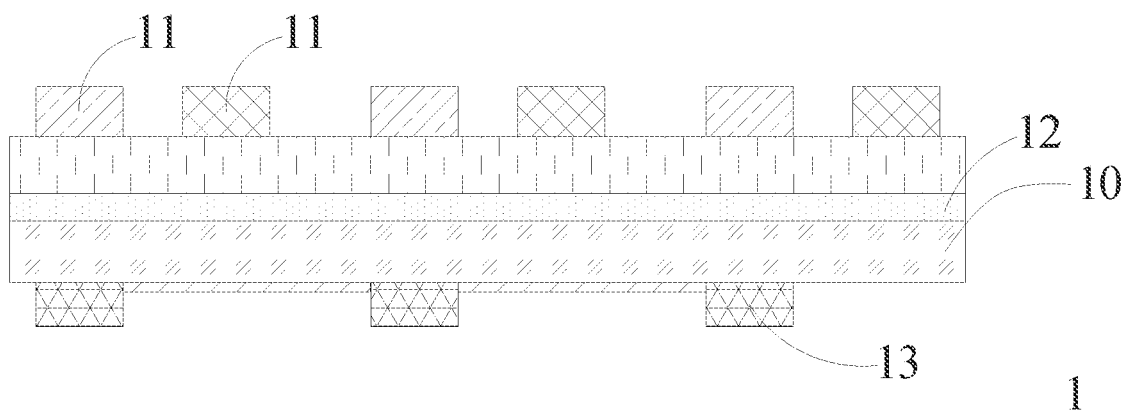
FIG. 14 is a structural diagram of another display module provided in the embodiments of the present application.

In a possible embodiment, as shown in FIG. 14, an orthographic projection of the radiation component 12 on the substrate 10 covers an orthographic projection of the detection unit 13 on the substrate 10.

In the above embodiment, the orthographic projection of the detection unit 13 on the substrate 10 is disposed in the orthographic projection of the radiation component 12 on the substrate 10, so that the radiation component 12 may better absorb the infrared ray with interference, effectively block the infrared ray with interference from being detected by the detection unit 13, and prevent the infrared ray with interference from adversely affecting the detection result of the detection unit 13, At the same time, the heat of the light-emitting device 11 may be more fully acquired and transmitted to the detection unit 13 in the form of radiation signal, so that the detection unit 13 may detect the heat of the light-emitting device 11 more accurately.

Figure 15:
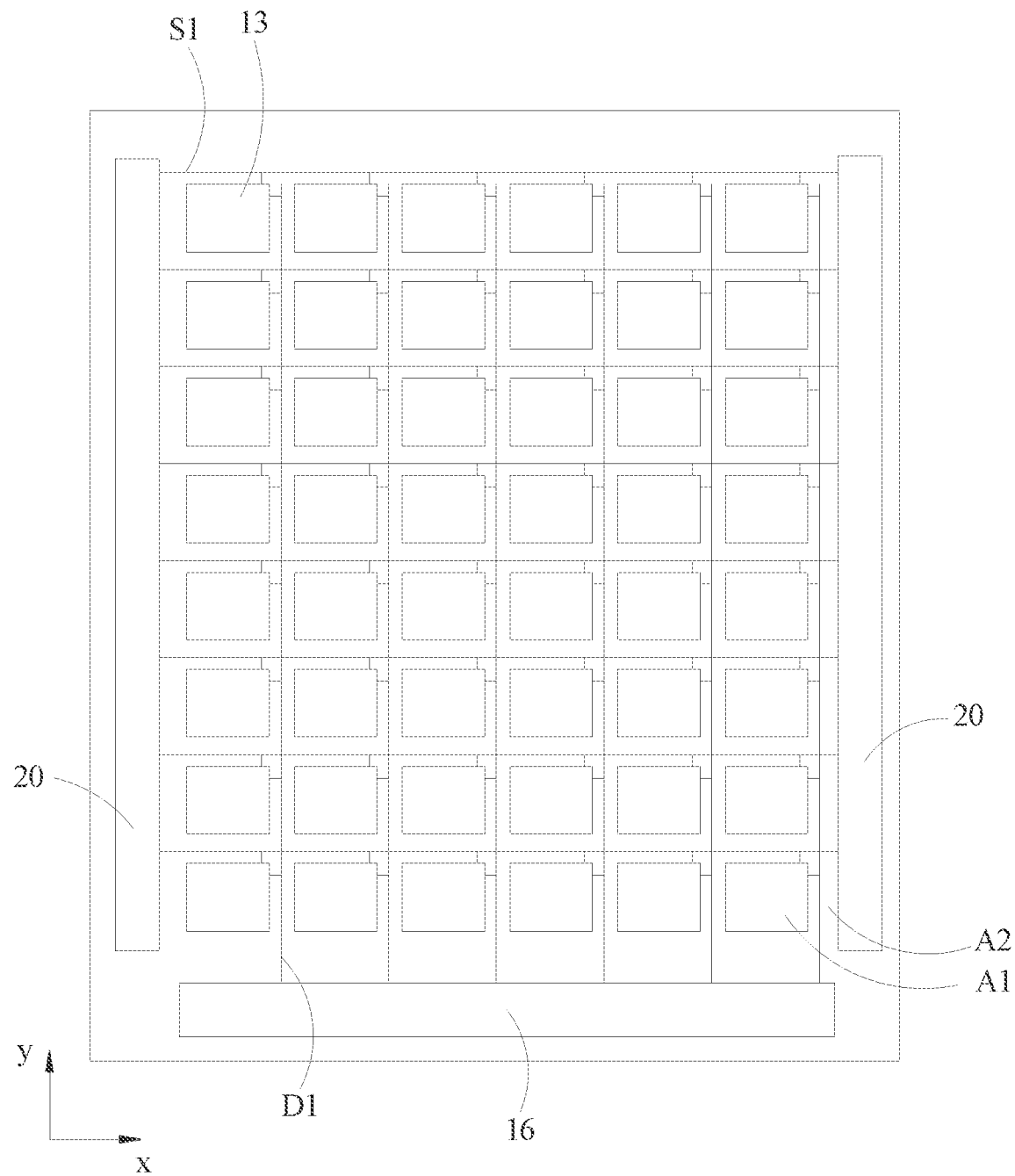
FIG. 15 is a bottom view of a display module provided in the embodiments of the present application.

In a possible embodiment, as shown in FIG. 15, the display module 1 also includes a temperature detection driver 16, and a plurality of detection units 13 are arranged in an array. The adjacent detection units 13 along a first direction x are connected by a scanning signal line S1, and the adjacent detection units 13 along a second direction y are connected to a temperature detection driver 16 by a data transmission signal line D1, wherein the first direction x intersects the second direction y.

In the above embodiments, the first direction x may be a row direction, and the second direction y may be a column direction. The temperature detection driver 16 and the detection unit 13 may be arranged on the same side and the same layer of the substrate 10.

Figure 16:
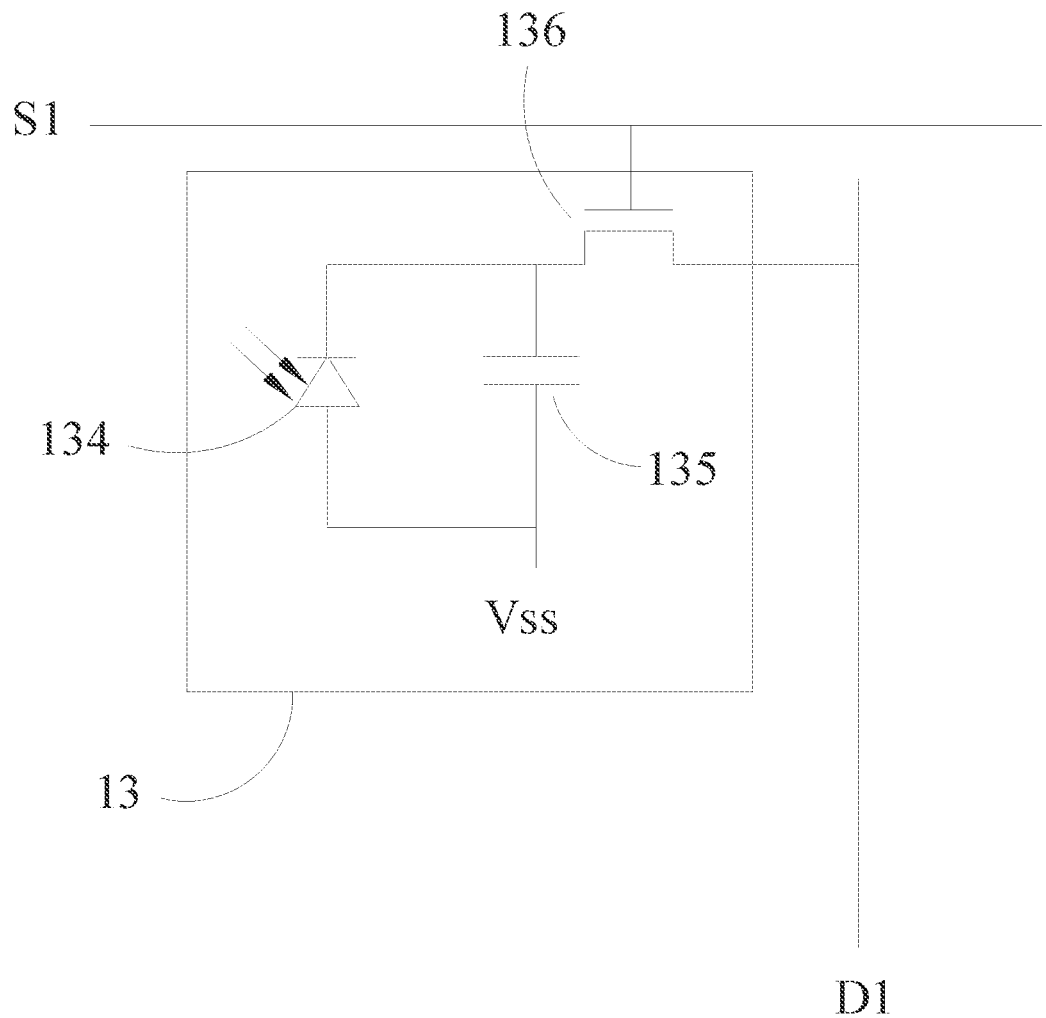
FIG. 16 is a structural diagram of a detection unit of a display module provided in the embodiments of the present application.

In the above embodiment, a scanning signal generation unit 20 is also involved, which is configured to generate a scanning signal, a scanning signal line S1 is connected to the scanning signal generation unit 20, and the scanning signal line S1 is configured to provide the scanning driving signal for the detection unit 13 to control whether the first signal acquired by the detection unit 13 is transmitted. The data transmission signal line D1 is configured to transmit the detected first signal to the temperature detection driver 16. As shown in FIG. 16, the detection unit 13 may include an infrared detection diode 134, a storage capacitor 135, and a switching transistor 136. A cathode of the infrared detection diode 134 and a first electrode plate of the storage capacitor 135 are connected, and are both connected to the first fixed voltage Vss. The anode of the infrared detection diode 134 and a second electrode of the storage capacitor 135 are connected, and are both connected to the first electrode of the switching transistor 136. The second electrode of the switching transistor 136 is connected to the data transmission signal line D1, and a control terminal of the switching transistor 136 is connected to the scanning signal line S1. When the radiation signal is sensed by the infrared detection diode 134, the radiation signal is converted into a first signal and stored in the storage capacitor 135. The first signal is an electrical signal. When the scanning signal line S1 scans a detection unit 13 and drives the switching transistor 136 in the detection unit 13 to turn on, the first signal in the storage capacitor 135 is transmitted to the temperature detection driver 16 through the switching transistor 136 and the data transmission signal line D1. Thus, the radiation signal may be converted into electrical signal. The temperature detection driver 16 may convert the first signal into a temperature signal for characterizing the heat of the light emitting device 11, thereby making temperature detection for the light emitting device 11.

In a possible embodiment, the display module 1 includes a plurality of light emitting regions A1 and a light transmitting region A2 around the light emitting region A1. The detection unit 13 is located in the light emitting region A1, and the scanning signal line S1 and the data transmission signal line D1 are both made of transparent conductive materials.

The display module 1 may be a light transmitting display module 1, including a light emitting region A1 and a light transmitting region A2 arranged alternately with each other. The light emitting region A1 is used for display, including the light emitting device 11. The light transmitting region A2 is not used for display, but only for light transmission, excluding the light emitting device 11. The detection unit 13 is arranged in the light emitting region A1. On one hand, the detection unit 13 may correspond to the light emitting device 11 to make the detection result more accurate. On the other hand, the detection unit 13 is only located in the light emitting region A1 but not in the light transmitting region A2, which may prevent the light transmission rate of the light transmitting region A2 from being affected, so as to prevent the performance of the light transmitting display panel from being affected.

In the above embodiment, the light transmitting region A2 is disposed adjacent to the light emitting region A1. The scanning signal line S1 and the data transmitting signal line D1 need to pass through the light transmitting region A2 to connect the detection units 13 located in different light emitting regions A1. The scanning signal line S1 and the data transmitting signal line D1 are both made of transparent conductive materials, which may effectively reduce the impact on the light transmittance of the light transmitting region A2, thus ensuring the performance of the light transmitting display module 1.

Specifically, the transparent conductive material can be indium tin oxide, which has good light transmittance and strong conductivity.

Figure 17:
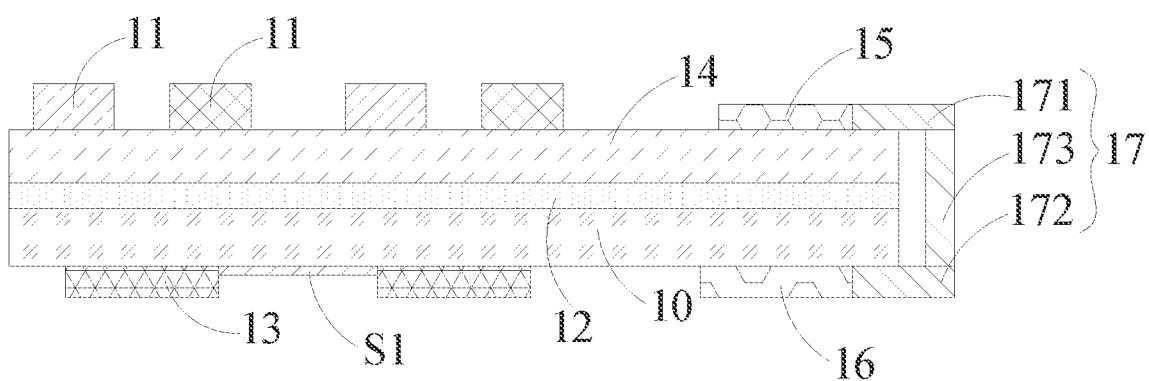
FIG. 17 is a structural diagram of another display module provided in the embodiments of the present application.

In a possible embodiment, as shown in FIG. 17, the display module 1 also includes an array layer 14 and a driving chip 15 connected to the array layer 14, the temperature detection driver 16 is connected to the driving chip 15 through the connection component 17.

In the above display module 1, the array layer 14 includes a driving circuit for driving the light-emitting device 11, the driving circuit is connected with the driving chip 15, and the driving chip 15 is configured to control the driving circuit. Specifically, the driving chip 15 may adjust the brightness of the light emitting device 11 or the like by controlling the driving circuit. In the above embodiment, the temperature detection driver 16 may be on the same layer with the detection unit 13 to connect the driving chip 15 with the temperature detection driver 16. After the temperature of the light-emitting device is detected by the temperature detection driver 16, the temperature signal is transmitted to the driving chip 15. The driving chip 15 may adjust the brightness of the light-emitting device 11 according to the temperature of the light-emitting device 11 to compensate the temperature of the light-emitting device 11, improving the display quality of display module 1.

In a possible embodiment, as shown in FIG. 17, the connection component 17 includes a first flexible circuit board 171 connected with the driving chip 15, a second flexible circuit board 172 connected with the temperature detection driver 16, and a connector 173 for connecting the first flexible circuit board 171 with the second flexible circuit board 172. In the direction parallel to the plane of the substrate 10, a preset distance is spaced between the connector 173 and the substrate 10.

In the above embodiment, the temperature detection driver 16 is located on one side of the substrate 10 opposite to the light emitting device 11, and the driving chip 15 is located on one side of the substrate 10 facing the light emitting device 11. Thus, the connection between the temperature detection driver 16 and the driving chip 15 may be implemented outside the substrate 10 through the connection component 17. Specifically, the connection assembly 17 includes a first flexible circuit board 171, a second flexible circuit board 172, and a connector 173. The connector 173 is located outside the substrate 10 and is spaced at a preset distance from the substrate 10 to prevent the heat of the connector 173 from being transferred to the substrate 10, thereby affecting the heat of the light-emitting device 11 acquired by the radiation component 12. One terminal of the connector 173 is connected to the driving chip 15 through the first flexible circuit board 171, and the other terminal is connected to the temperature detection driver 16 through the second flexible circuit board 172, for making connection between the temperature detection driver 16 and the driving chip 15.

Figure 18:
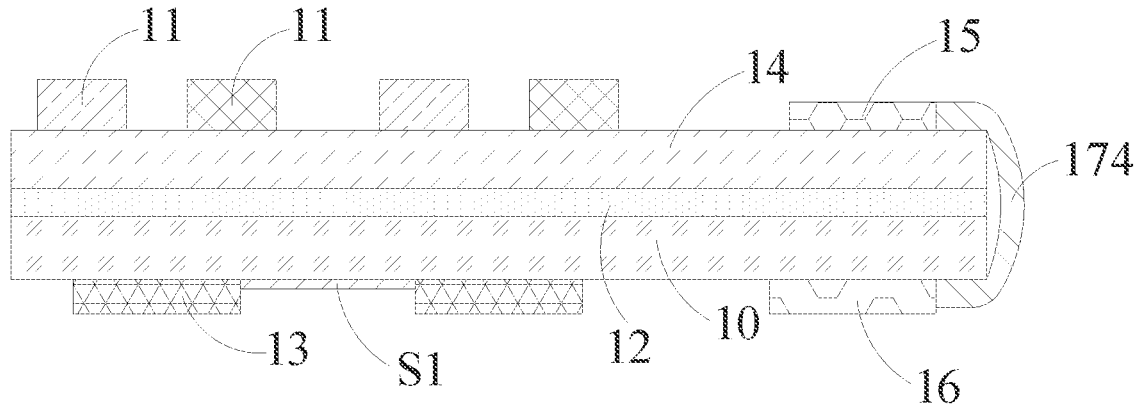
FIG. 18 is a structural diagram of another display module provided in the embodiments of the present application.

In another possible embodiment, as shown in FIG. 18, the connection component 17 includes a flexible circuit board 174. One terminal of the flexible circuit board 174 is connected to the driving chip 15, and the other terminal is connected to the temperature detection driving device 16. The flexible circuit board 174 is fixed on the substrate 10 and may be bent towards one side of the substrate 10 away from the array layer 14.

In the above embodiment, the temperature detection driver 16 is located on one side of the substrate 10 away from the light emitting device 11, and the driving chip 15 is located on one side of the substrate 10 facing the light emitting device 11. Therefore, the flexible circuit board 174 can be bent from one side of the substrate 10 to the other side to make connection between the temperature detection driver 16 and the driving chip 15. Specifically, one terminal of the flexible circuit board 174 is connected to the driving chip 15, and the other terminal is bent towards one side of the substrate 10 away from the driving chip 15 and connected to the temperature detection driver 16. The embodiment may save the number of devices in the display module 1 to achieve its lightweight.

Figure 19:
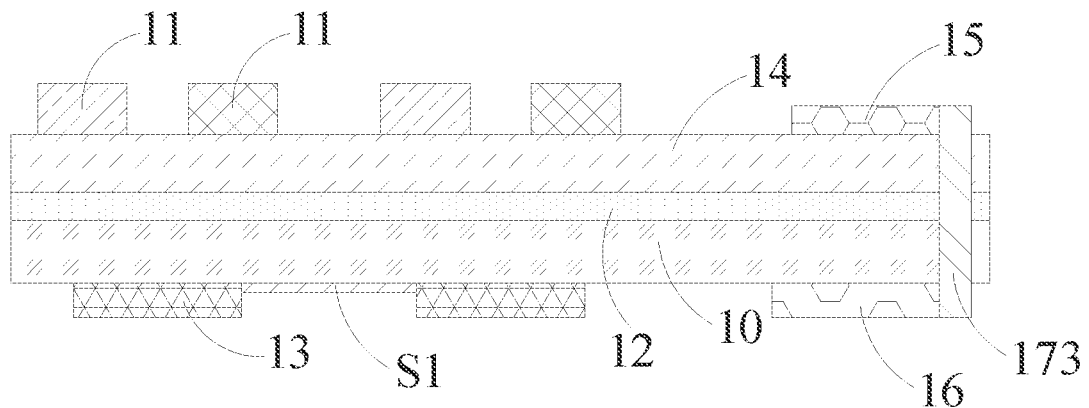
FIG. 19 is a structural diagram of another display module provided in the embodiments of the present application.

In a possible embodiment, as shown in FIG. 19, the connection component 17 includes a connector 173, which is located in a via through the thickness direction of the display module 1. One terminal of the connector 173 is connected to the driving chip 15, and the other terminal is connected to the temperature detection driver 16.

In the above embodiment, the temperature detection driver 16 is located on one side of the substrate 10 opposite to the light-emitting device 11, and the driving chip 15 is located on one side of the substrate 10 facing the light-emitting device 11. Therefore, the connection between the temperature detection driver 16 and the driving chip 15 may be made through a via through the substrate 10 and a connector 173 in the via. One terminal of the connector 173 is connected to the driving chip 15, and the other terminal is connected to the temperature detection driver 16 after passing through the via, which connection mode makes the display module 1 more compact, to reduce the proportion of non-display regions, and increases the proportion of display regions to improve user experience.

Figure 20:
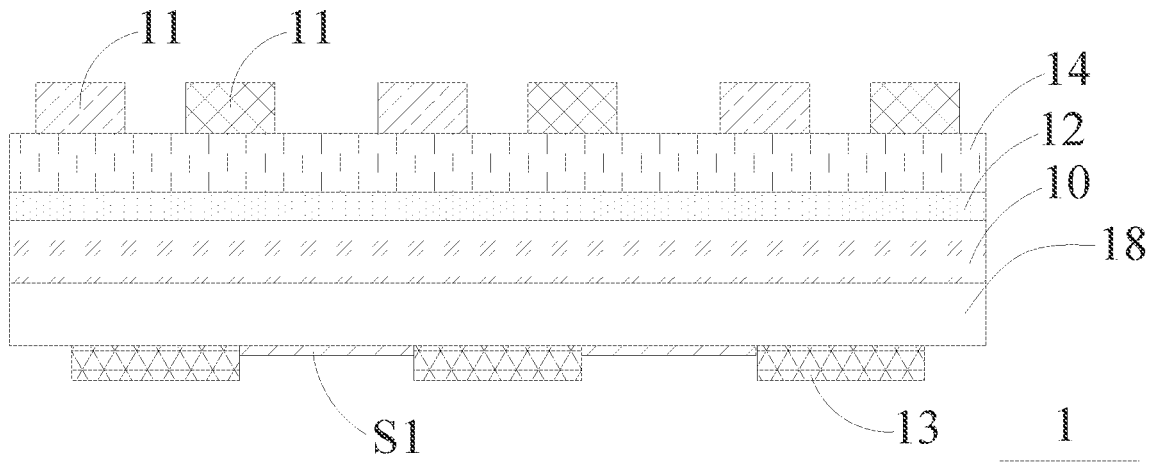
FIG. 20 is a structural diagram of another display module provided in the embodiments of the present application.

In a possible embodiment, as shown in FIG. 20, the display module 1 also includes a bearing base 18, and the detection unit 13 is located on one side of the bearing base 18 opposite to the substrate 10. In the above embodiment, the display module 1 also includes a bearing base 18, which is configured to support the detection unit 13, the data transmission signal line D1, the scanning signal line S1, the temperature detection driver 16, etc. The bearing base 18 is made of transparent materials, which may be glass or silicon. The bearing base 18 may reduce the heat transfer from one side of the substrate 10 away from the light-emitting device 11 to the radiation component 12, so as to further isolate the influence of temperature on the radiation component 12, and make the heat obtained by the radiation component closer to the actual heat of the light-emitting device 11.

Figure 21:
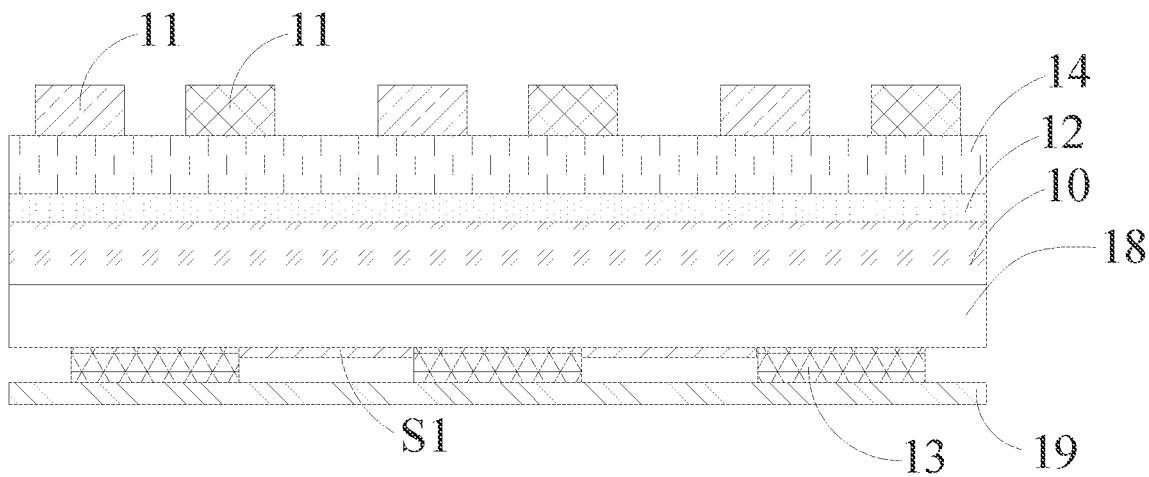
FIG. 21 is a structural diagram of another display module provided in the embodiments of the present application.

In a possible embodiment, as shown in FIG. 21, the display module 1 also includes a grounding metal film 19, which is arranged on one side of the detection unit 13 away from the substrate 10.

In the above embodiment, the grounded metal film 19 is arranged on one side of the detection unit 13 away from the substrate 10, which is configured to shield the interference of the external electric field and the external temperature on the data outgoing signal line D1 and the scanning signal line S1, reducing the occurrence of distortion problems in the signal transmission process, and reducing the heat transfer from one side of the substrate 10 away from the light-emitting device 11 to the radiation component 12, so as to further isolate the influence of temperature on the radiation component 12.

Figure 22:
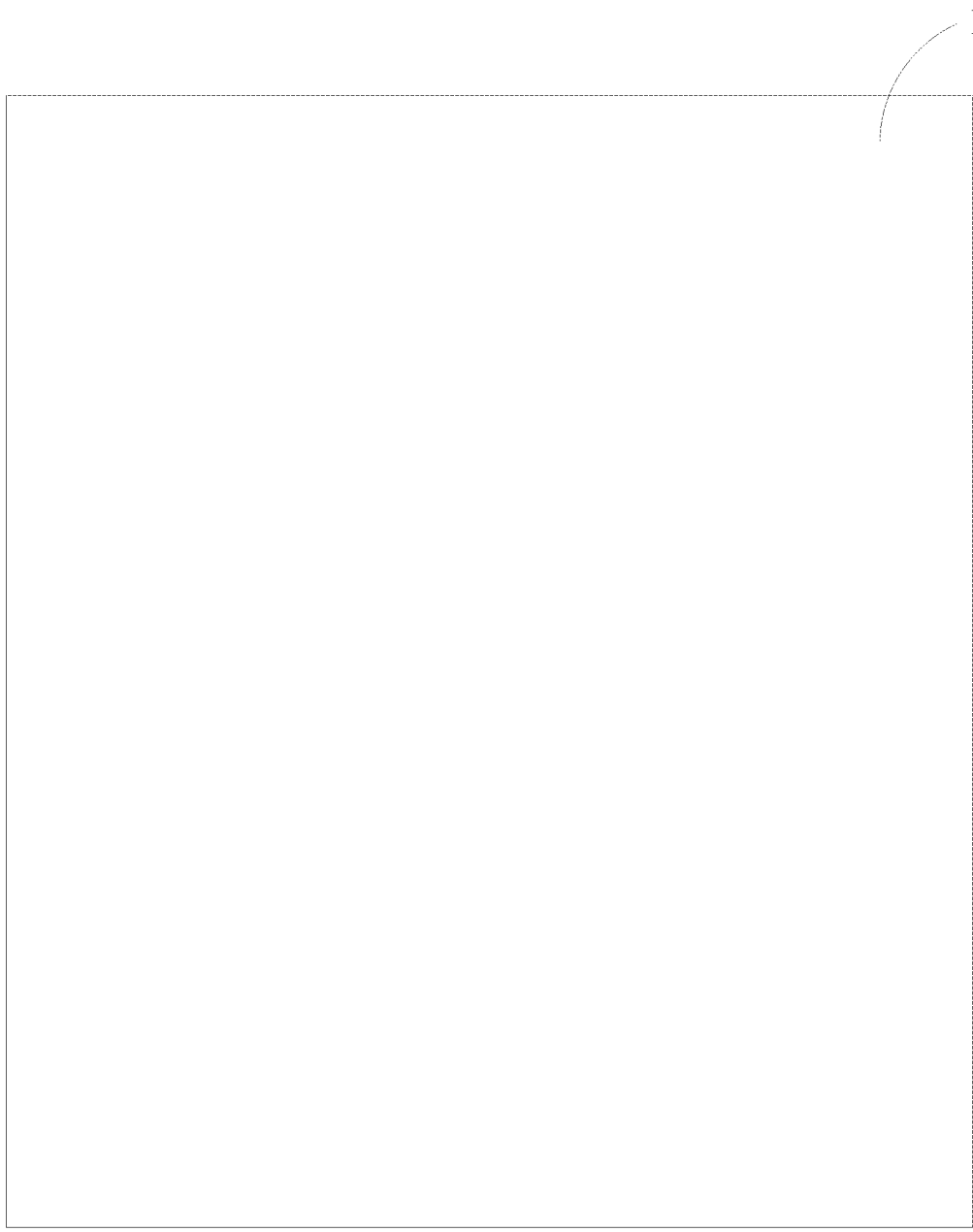
FIG. 22 is a structural diagram of a display device provided in the embodiments of the present application.

A display device 2 is also provided in the present application, as shown in FIG. 22, including any of display module 1 provided in the above embodiments of the present application.

The display device 2 may detect the temperature of the light emitting device 11 in the display module 1, and compensate the light emission of the light emitting device 11 according to the temperature of the light emitting device 11, so as to improve the light output of the display device 2 and reducing the occurrence of problems affecting the display quality due to temperature affecting the luminous efficiency of the light emitting device 11. At the same time, the above temperature detection is realized by disposing the radiation component 12 and the detection unit 13 in the display module 1. The wireless transmission between the radiation component 12 and the detection unit 13 may effectively improve the signal distortion in the temperature detection process, and the signal transmission effect is more accurate, so that the temperature detection of the light-emitting device 11 is more accurate. Thus, when the light-emitting device 11 is compensated according to the temperature of the light-emitting device 11, the compensation accuracy is improved to further improve the display quality of the display module 1. The display quality of the display device 2 is significantly improved, thereby greatly improving user experience.

According to the present application, such as the above embodiments, these embodiments do not describe all details in detail, nor limit the specific embodiments. Obviously, many modifications and changes may be made according to the above description. These embodiments are selected and specifically described in this specification in order to better explain the principle and practical application of this application, so that those skilled in the art can make good use of this application and make amendments on the basis of this application. The present application is only limited by the claims and full scope and equivalents thereof.

What is claimed is:

1. A display module, comprising:
   a substrate;
   a light emitting device on one side of the substrate;
   a radiation component on one side of the light-emitting device close to the substrate and on a side of the substrate close to the light emitting device, an orthographic projection of the radiation component on the substrate overlapping at least in part with an orthographic projection of the light-emitting device on the substrate, the radiation component being configured to radiate heat of the light-emitting device in a form of a radiation signal; and
   a detection unit for detecting the radiation signal, the radiation signal being capable of characterizing thermal parameters of the light emitting device, and the detection unit being disposed on a side of the substrate away from the light-emitting device.

2. The display module of claim 1, wherein the radiation component is a light absorbing film, and the radiation signal is infrared.

3. The display module of claim 2, further comprising:
   an array layer on one side of the light emitting device close to the substrate,
   the radiation component being located on one side of the array layer close to the substrate.

4. The display module of claim 1, wherein the display module comprises a plurality of the light emitting devices, and the radiation component corresponds to at least one of the plurality of the light emitting devices.

5. The display module of claim 4, wherein
   the display module comprises a plurality of the radiation components,
   the plurality of the radiation components comprises a first radiation component and a second radiation component,
   the first radiation component corresponds to a number M of the plurality of the light-emitting devices, the second radiation component corresponds to a number N of the plurality of the light-emitting devices, and one of M and N is greater than the other.

6. The display module of claim 5, wherein the display module comprises a middle display region around the center of the display module and an edge display region around the middle display region;
   the first radiation component is located in the middle display region, and the second radiation component is located in the edge display region;
   wherein M<N.

7. The display module of claim 6, wherein
   the display module comprises a plurality of the detection units comprising at least one first detection unit and at least one second detection unit,
   the first radiation component corresponds to the at least one first detection unit,
   the second radiation component corresponds to the at least one second detection unit, and
   the at least one first detection unit each corresponds to a number P of the plurality of the light-emitting devices, and the at least one second detection unit each corresponds to a number Q of the plurality of the light-emitting devices, wherein P≤Q.

8. The display module of claim 6, wherein
the display module further comprises a transition display region between the middle display region and the edge display region, and
the plurality of the radiation components further comprises a third radiation component located in the transition display region, and the third radiation component corresponds to a number S of the plurality of the light-emitting devices, where M<S<N.

9. The display module of claim 8, wherein
the display module comprises a plurality of the detection units comprising at least one first detection unit, at least one second detection unit, and at least one third detection unit,
the first radiation component corresponds to the at least one first detection unit, the second radiation component corresponds to the at least one second detection unit, and the third radiation component corresponds to the at least one third detection unit, and
the at least one first detection unit each corresponds to a number P of the plurality of the light-emitting devices, the at least one second detection unit each corresponds to a number Q of the plurality of the light-emitting devices, and the at least one third detection unit corresponds to a number T of the plurality of the light-emitting devices, wherein P≤T≤Q.

10. The display module of claim 4, wherein the display module comprises a plurality of the light emitting devices comprising at least one first color light emitting device and at least one second color light emitting device;
the detection unit corresponds to the at least one first color light emitting device, and a wavelength of light emitted by the at least one first color light emitting device is greater than a wavelength of light emitted by the at least one second color light emitting device.

11. The display module of claim 10, wherein
the display module comprises a plurality of the radiation components comprising fourth radiation components and fifth radiation components,
each of the fourth radiation components corresponds to the at least one first color light emitting device, and the fourth radiation components have a same area, and
each of the fifth radiation components corresponds to the at least one second color light emitting device, and the fifth radiation components have a same area.

12. The display module of claim 1, wherein the display module has a plurality of light emitting regions and a light transmitting region located around the light emitting region, the light emitting region is provided with at least one said light emitting device, and the radiation component is located in the light emitting region; or
the orthographic projection of the radiation component on the substrate covers the orthographic projection of the detection unit on the substrate.

13. The display module of claim 1, wherein
the display module comprises a temperature detection driver, and a plurality of the detection units arranged in an array,
adjacent detection units of the plurality of the detection units in a first direction are connected to each other by a scanning signal line, and
adjacent detection units of the plurality of the detection units in a second direction are connected to the temperature detection driver by a data transmission signal line, wherein the first direction intersects the second direction.

14. The display module of claim 13, wherein the display module comprises a plurality of light emitting regions and a light transmitting region around the light emitting region, the detection unit is located in the light emitting region, and the scanning signal line and the data transmission signal line are both made of transparent conductive materials.

15. The display module of claim 13, wherein the display module further comprises an array layer and a driving chip connected to the array layer, and the temperature detection driver is connected to the driving chip through a connection component.

16. The display module of claim 15, wherein the connection component comprises a first flexible circuit board connected to the driving chip, a second flexible circuit board connected to the temperature detection driver, and a connector for connecting the first flexible circuit board with the second flexible circuit board, the connector and the substrate are spaced apart from each other by a preset distance in a direction parallel to a plane of the substrate; or,
the connection component comprises a flexible circuit board, one terminal of which is connected to the driving chip, and the other terminal is connected to the temperature detection driver, the flexible circuit board is fixed on the substrate and bent towards one side of the substrate away from the array layer.

17. The display module of claim 1, wherein the display module further comprises a bearing base, and the detection unit is located on one side of the bearing base away from the substrate; or
the display module further comprises a grounding metal film arranged on one side of the detection unit away from the substrate.

18. A display device, comprising the display module, wherein the display module comprises:
a substrate;
a light emitting device on one side of the substrate;
a radiation component on one side of the light-emitting device close to the substrate and on a side of the substrate close to the light emitting device, an orthographic projection of the radiation component on the substrate overlapping at least in part with an orthographic projection of the light-emitting device on the substrate, the radiation component being configured to radiate heat of the light-emitting device in a form of a radiation signal; and
a detection unit for detecting the radiation signal, the radiation signal being capable of characterizing thermal parameters of the light emitting device, and the detection unit being disposed on a side of the substrate away from the light-emitting device.

19. A display module, comprising:
a substrate;
light emitting devices on one side of the substrate;
radiation components disposed on one side of the light-emitting devices close to the substrate and configured to radiate heat of the light-emitting devices in a form of a radiation signal, an orthographic projection of at least one of the radiation components on the substrate overlapping at least in part with an orthographic projection of at least one of the light-emitting devices on the substrate; and a detection unit for detecting the radiation signal, the radiation signal being capable of characterizing thermal parameters of the at least one of the light emitting devices, wherein one of the radiation components corresponds to at least one of the light emitting devices; and the radiation components are formed by patterning and comprise a first radiation component and a second radiation component that are independent from each other, the first radiation component corresponds to a number M of the light-emitting devices, and the second radiation component corresponds to a number N of the light-emitting devices, and one of M and N is greater than the other.

20. A display device, comprising the display module of claim 19.

* * * * *